(12) United States Patent
Hasegawa

(10) Patent No.: US 6,542,419 B2
(45) Date of Patent: Apr. 1, 2003

(54) SEMICONDUCTOR INTEGRATED CIRCUIT DEVICE WITH ELECTRICALLY PROGRAMMABLE FUSE

(75) Inventor: Takehiro Hasegawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/934,834

(22) Filed: Aug. 23, 2001

(65) Prior Publication Data

US 2002/0047181 A1 Apr. 25, 2002

(30) Foreign Application Priority Data

Aug. 24, 2000 (JP) ........................................ 2000-254151

(51) Int. Cl.⁷ ................................................. G11C 7/00
(52) U.S. Cl. ................ 365/200; 365/225.7; 365/189.05
(58) Field of Search ............................. 365/200, 225.7, 365/203, 189.05, 230.06, 230.08

(56) References Cited

U.S. PATENT DOCUMENTS

| 5,110,754 A | | 5/1992 | Lowrey et al. | |
| 5,313,424 A | | 5/1994 | Adams et al. | |
| 5,495,446 A | * | 2/1996 | Teel et al. | 365/200 |
| 5,668,818 A | | 9/1997 | Bennett et al. | |
| 5,956,282 A | | 9/1999 | Casper | |
| 6,166,981 A | * | 12/2000 | Kirihata et al. | 365/200 |
| 6,178,125 B1 | * | 1/2001 | Niiro | 365/200 |

* cited by examiner

Primary Examiner—David Lam
(74) Attorney, Agent, or Firm—Oblon, Spivak, McClelland, Maier & Neustadt, P.C.

(57) ABSTRACT

A fuse circuit 1 comprises an electrically programmable fuse 10 and a data latch circuit 11 to hold programmed fuse data. In the data latch circuit 11, prior to programming, a node FUADD is precharged to "H" by a precharge circuit 14 and preset at "H" as the result of the logical product of a fail address FAADD and a latch signal LATCHp by a preset circuit 12 when the fuse 10 needs to be programmed. A programming selecting circuit 13 monitors the node FUADD to select whether to perform or not to performance the programming of the fuse 10. Accordingly, efficient electric programming control becomes possible without using a dedicated register to hold a fuse address to be programmed.

27 Claims, 8 Drawing Sheets

SEMICONDUCTOR INTEGRATED CIRCUIT DEVICE WITH ELECTRICALLY PROGRAMMABLE FUSE

CROSS REFERENCE TO RELATED APPLICATION

This application claims benefit of priority under 35 U.S.C. §119 to Japanese Patent Application No. 2000-254151, filed on Aug. 24, 2000, the entire contents of which are incorporated by reference herein.

BACKGROUND OF THE INVENTION

1. Field of the Invention

The present invention relates to a semiconductor integrated circuit device including an electrically programmable fuse.

2. Related Background Art

A semiconductor integrated circuit on which a memory is mounted hitherto includes a redundancy circuit to relieve defective memory cells. The redundancy circuit comprises a spare cell array configured to replace a defective cell and disposed separately from a normal cell array and a fail address storage circuit configured to store an address of the defective cell and detect a coincidence of an address inputted from the outside and the fail address to output a replacing signal.

A fuse is usually used in the fail address storage circuit. A laser blown fuse is typical of this kind of fuse. The fail address is stored by blowing a fuse corresponding to the fail address detected by a die sort test in a wafer stage.

Since the laser blown fuse is blown by the irradiation of a laser beam from the outside, it can not cope with defects detected after an integrated circuit chip is packaged. The use of an electrically programmable fuse is required to enable programming even after the integrated circuit chip is packaged. A method of using a capacitor-type fuse, which uses a thin insulating film and becomes conductive by destroying the insulating film by the application of high voltage, as such a fuse is already disclosed (See U.S. Pat. No. 5,110,754, for example).

When the aforesaid capacitor-type fuse to be electrically programmed is used, however, a test for analyzing the fail address after the packaging of the integrated circuit chip is necessary, which causes an increase in test cost. In the case of a DRAM mounted on a logic integrated circuit (embedded DRAM), there are very few pins for testing a DRAM section, and thus it is difficult to test the DRAM section by inputting an address and data from the outside.

To eliminate such disadvantages, a method of mounting a BIST (Built In Self-test) circuit to test a memory cell array internally together with a fuse to be programmed electrically on a chip is disclosed (See U.S. Pat. No. 5,313,424, for example). This BIST circuit automatically tests a cell array by a trigger signal from the outside to detect fail addresses. The detected fail addresses are transferred to a fuse circuit and electrical programming is performed.

In BIST circuit methods hitherto disclosed, however, a dedicated register to hold fail addresses detected automatically is used, and besides a complicated control circuit is required to control the fuse circuit. For this reason, there is a disadvantage that the area of the integrated circuit chip increases.

SUMMARY OF THE INVENTION

According to one aspect of the present invention, a semiconductor integrated circuit device, comprising:

a fuse to be electrically programmed;
a data latch circuit configured to hold fuse data programmed into the fuse after the fuse is programmed;
a data preset circuit configured to preset data to be programmed into the fuse in the data latch circuit before the fuse is programmed; and
a programming selecting circuit configured to monitor a state of data in the data latch circuit and select whether to perform or not to perform a programming operation for the fuse.

According to another aspect of the present invention, a semiconductor integrated circuit device, comprising:

a memory cell array having a normal cell array and a spare cell array for replacing a defect cell in the normal cell array;
a decode circuit configured to select a memory cell from the memory cell array; and
a fail address storage circuit configured to store a fail address and output a replacing signal when an inputted address coincides with the fail address to switch-control the decode circuit so that the spare cell array is selected, the fail address storage circuit including;
a plurality of fuses to be electrically programmed;
data latch circuits provided in the respective fuses to hold fuse data programmed into the fuses after the fuses are programmed;
data preset circuits configured to preset fail address data to be programmed in the respective data latch circuits before the fuses are programmed; and
programming selecting circuits configured to monitor states of data in the respective data latch circuits and select whether to perform or not to perform a programming operation for each of the fuses; and
a programming control circuit configured to divide the plurality of fuses into a plurality of groups and perform an operation of programming fuses all at once in the respective groups in turn.

According to a further aspect of the present invention, a semiconductor integrated circuit device, comprising:

a plurality of fuses to be electrically programmed;
data latch circuits provided in the respective fuses to latch data to be programmed in the fuses;
programming selecting circuits configured to monitor states of data in the respective data latch circuits and select whether to perform or not to perform a programming operation for each of the fuses;
a programming control circuit configured to divide the plurality of fuses into a plurality of groups and perform an operation of programming fuses all at once in the respective groups in turn; and
read circuits configured to perform a read operation of fuse data programmed in each fuse after a programming operation for a plurality of fuses in a predetermined group by the programming control circuit,
wherein the programming control circuit comprises:
a completion judging circuit configured to judge in each group whether programming for all fuses to be programmed in the group is completed or not based on the read operation by the read circuit; and
a selecting signal output circuit configured to output a selecting signal for activating the programming selecting circuits in each group in sequence in response to a judging signal obtained from the completion judging circuit.

DETAILED DESCRIPTION OF THE INVENTION

Embodiments of the present invention will be explained below with reference to the drawings.

Figure 1:
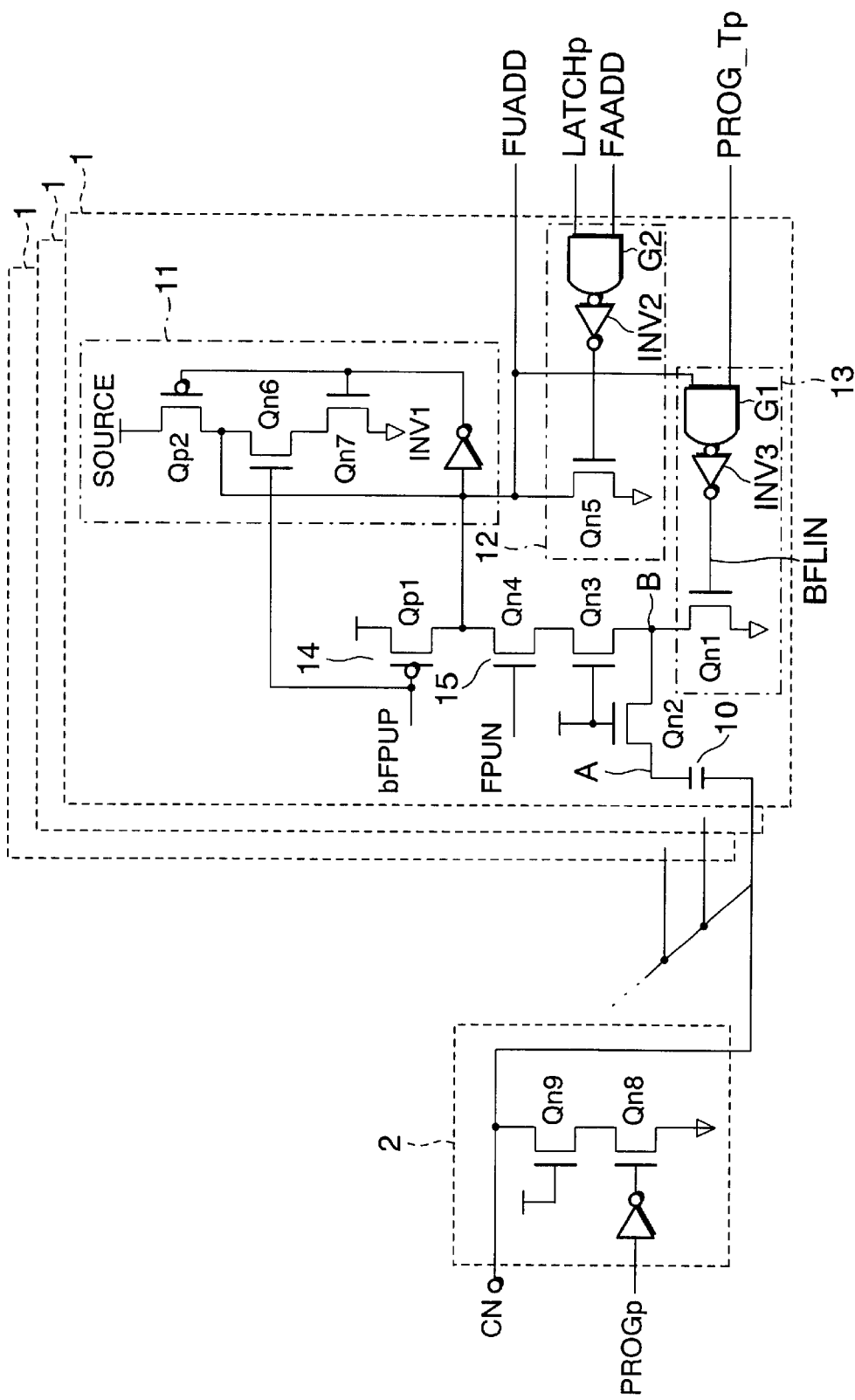
FIG. 1 is a diagram showing the configuration of a fuse circuit according to a first embodiment of the present invention.

FIG. 1 shows the configuration of an equivalent circuit of a fuse circuit mounted on a semiconductor integrated circuit chip according to a first embodiment of the present invention. Each of a plurality of fuse circuit units 1 has, for example, a capacitor-type fuse 10 which performs electrical programming to store a fail address, and a data latch circuit 11 to hold programmed fuse data. The fuse 10 is non-conductive before being programmed, and becomes conductive by applying a high voltage thereto to destroy a capacitor insulating film. As the fuse 10, an MOS capacitor fabricated by the same process as an MOS transistor, a capacitor similar to a DRAM trench capacitor, or the like is used. Alternatively, a fuse which is blown by sending an electric current thereto can be also used.

One node of the fuse 10 contained in each of the plurality of fuse circuit units 1 is connected jointly to a common node CN composing a high-voltage applying circuit 2. A high voltage supplied to this common node CN may be inputted from the outside via a pad, or may be outputted from a high-voltage generating circuit therein. The high-voltage applying circuit 2 has an NMOS transistor Qn8 for a switch to ground the common node CN via a load NMOS transistor Qn9. Namely, while a programming signal PROGp is "L", the NMOS transistor Qn8 is on, and the common node CN is set at a low level. When the programming signal PROGp changes to "H", the NMOS transistor Qn8 is turned off, and the high voltage applied to the common node CN is supplied simultaneously to the fuses 10 of the respective fuse circuit units 1.

The other node A of the fuse 10 is connected to a node B via a transfer gate NMOS transistor Qn2 driven by a power source SOURCE, and the node B is connected to an output node (monitor node) FUADD of the data latch circuit 11 via a transfer gate NMOS transistor Qn3 driven by the power source SOURCE and via an NMOS transistor Qn4 composing a read circuit 15. The NMOS transistor Qn4 for read is selectively driven on by a read control signal FPUN when fuse data is transferred to the data latch circuit 11.

In this embodiment, the data latch circuit 11 has both the function of holding programmed fuse data and the function of presetting and holding data to be programmed at the time of fuse programming. The data latch circuit 11 is formed by connecting two inverters in parallel and in opposite directions. One inverter INV1 of the two inverters of the data latch circuit 11 is an ordinary CMOS inverter, and an NMOS transistor Qn6 as a switching element used in presetting data is inserted between a PMOS transistor Qp2 and an NMOS transistor Qn7 which compose the other inverter of the two inverters.

A gate of the NMOS transistor Qn6 of the data latch circuit 11 is controlled by a precharge signal bFPUP. The fuse circuit unit 1 includes a precharge circuit 14 composed of a PMOS transistor Qp1 to precharge the output node (monitor node) FUADD of the data latch circuit 11 to "H" in advance, a preset circuit 12 to perform discharge or non-discharge control for the precharged node FUADD according to a fail address FAADD, and a programming selecting circuit 13 to control a fuse programming operation while monitoring the preset node FUADD, so that the data latch circuit 11 is allowed to have the afore said fuse data holding function and data presetting function. A gate of the PMOS transistor Qp1 for precharge is controlled by the precharge signal bFPUP.

The preset circuit 12 has a NAND gate G2 to which a latch signal LATCHp and the fail address FAADD are inputted, an inverter INV2 to invert an output from the NAND gate G2, and an NMOS transistor Qn5 which is controlled by an output from the inverter INV2 to selectively ground the node FUADD. Namely, when the latch signal LATCHp is "H" and the fail address FAADD is "H" (which need not blow the fuse) at the same time, the NMOS transistor Qn5 is turned on, and the node FUADD precharged to "H" changes to "L". When the fail address FAADD is "L" (which needs to blow the fuse), the NMOS transistor Qn5 is not turned on, and the node FUADD maintains "H".

As described above, fuse data, that is, "H" in the case of the address which needs to blow the fuse or "L" in the case of the address which need not blow the fuse, depending on the fail address FAADD are held in the data latch circuit 11 prior to the programming operation by the precharge circuit 14 and the preset circuit 12. "H" data of the address which needs to blow the fuse 10 is held until the fuse 10 has been completely blown, whereby the programming control for the fuse 10 is performed. More specifically, as will be described later, in consideration of blowing characteristics of the fuse 10, the programming operation is performed in plural cycles with the blowing of the fuse 10 and its read verification as one cycle, and in the address in which the programming operation is completed, the node FUADD changes to "L".

The programming selecting circuit 13 monitors the output node FUADD of the data latch circuit 11 to perform programming control. The programming selecting circuit 13 has a NAND gate G1 to which a selecting signal PROG-Tp and a signal from the output node FUADD are inputted, an inverter INV3 to invert an output from the NAND gate G1, and an NMOS transistor Qn1 which is controlled by an output BFLIN from the inverter INV3 to selectively ground the node B. Namely, when the node FUADD is "H", the programming selecting circuit 13 has the function of grounding the node B by the selecting signal PROG-Tp, at which time the fuse 10 is programmed. Specifically, a high voltage is applied to the fuse 10, whereby an insulating film is destroyed, and the fuse 10 becomes conductive. When the node FUADD is "L", the node B is maintained in a floating state without being grounded by this programming selecting circuit 13, whereby the fuse 10 is not blown.

When the fuse 10 is blown, the node FUADD changes to "L" by a verification read operation in which a read signal FPUN is changed to "H". Specifically, the node FUADD is connected to the common node CN, which is set at a low level; via the fuse 10 which has become conductive and via the node B, and the node FUADD which has maintained "H" so far changes to "L". This indicates a programming completion signal. Once the fuse 10 is blown, the programming selecting circuit 13 becomes inactive, and the programming operation is not repeated for the same fuse 10. If the fuse 10 is not blown, the node FUADD still maintains "H" in the verification read, and programming is repeated.

In the circuit in FIG. 1, the voltage of the drive power source SOURCE for gate circuits of respective sections, the precharge circuit 14 and the transfer gate transistors Qn2 and Qn3 as well as the data latch circuit 11 is increased at the time of programming. This is in order to relax an electric field applied to the gates such as the NMOS transistors Qn2 and Qn3 when the voltage of the common node CN is high at the time of programming, and the voltage is set appropriately according to the voltage to be programmed.

Figure 2:
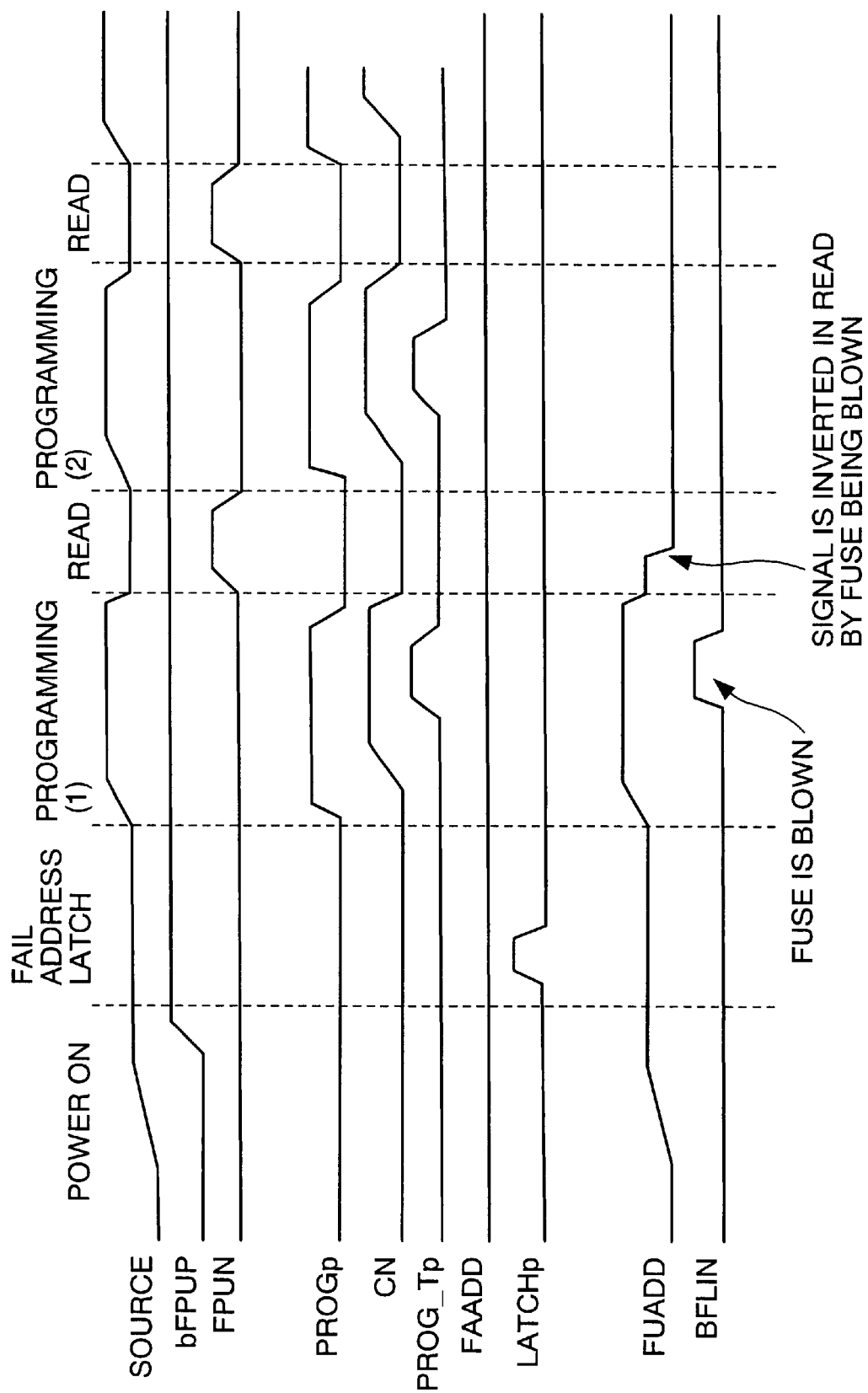
FIG. 2 is a diagram showing operating waveforms of the fuse circuit.
Figure 3:
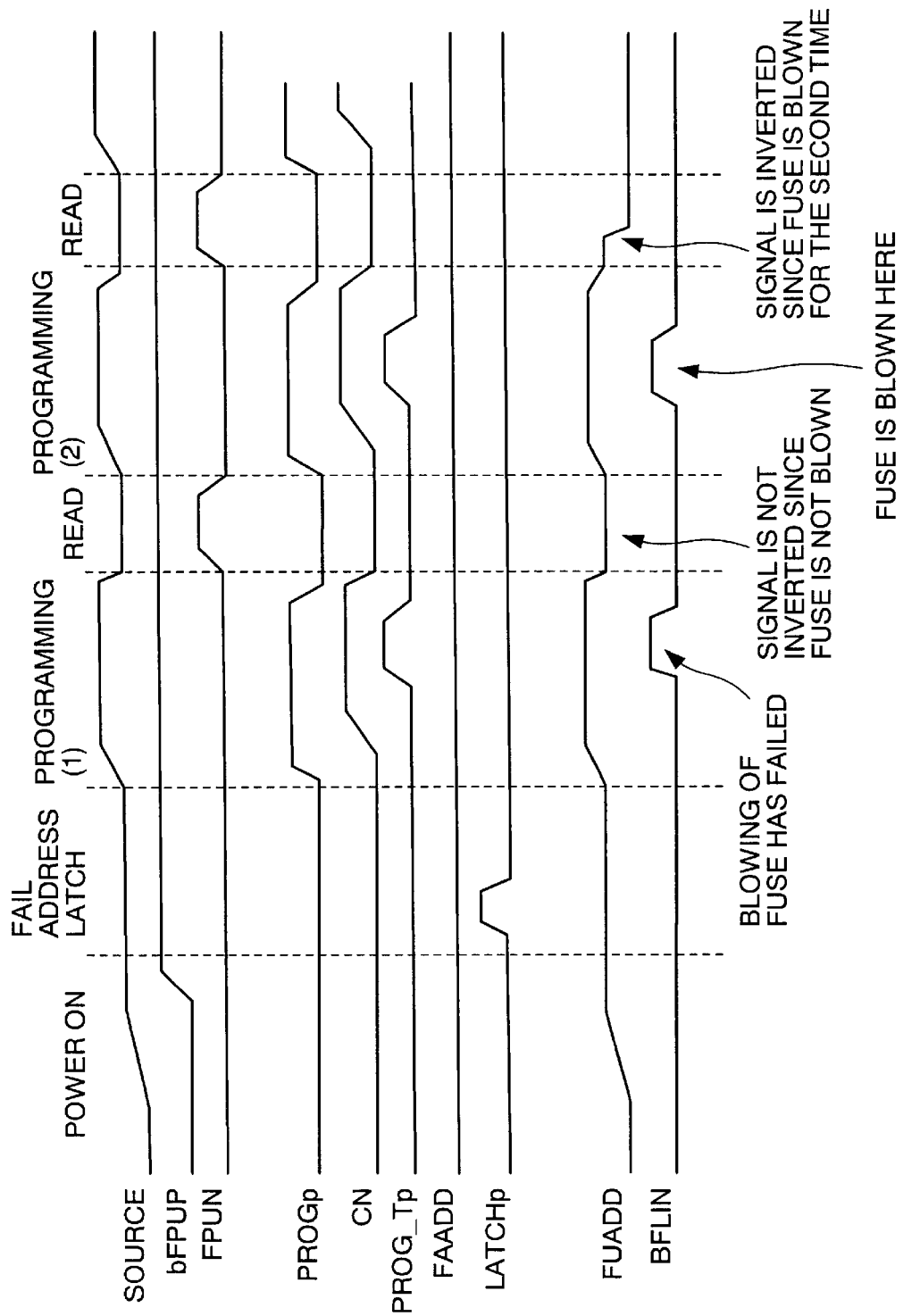
FIG. 3 is a diagram showing other operating waveforms of the fuse circuit.
Figure 4:
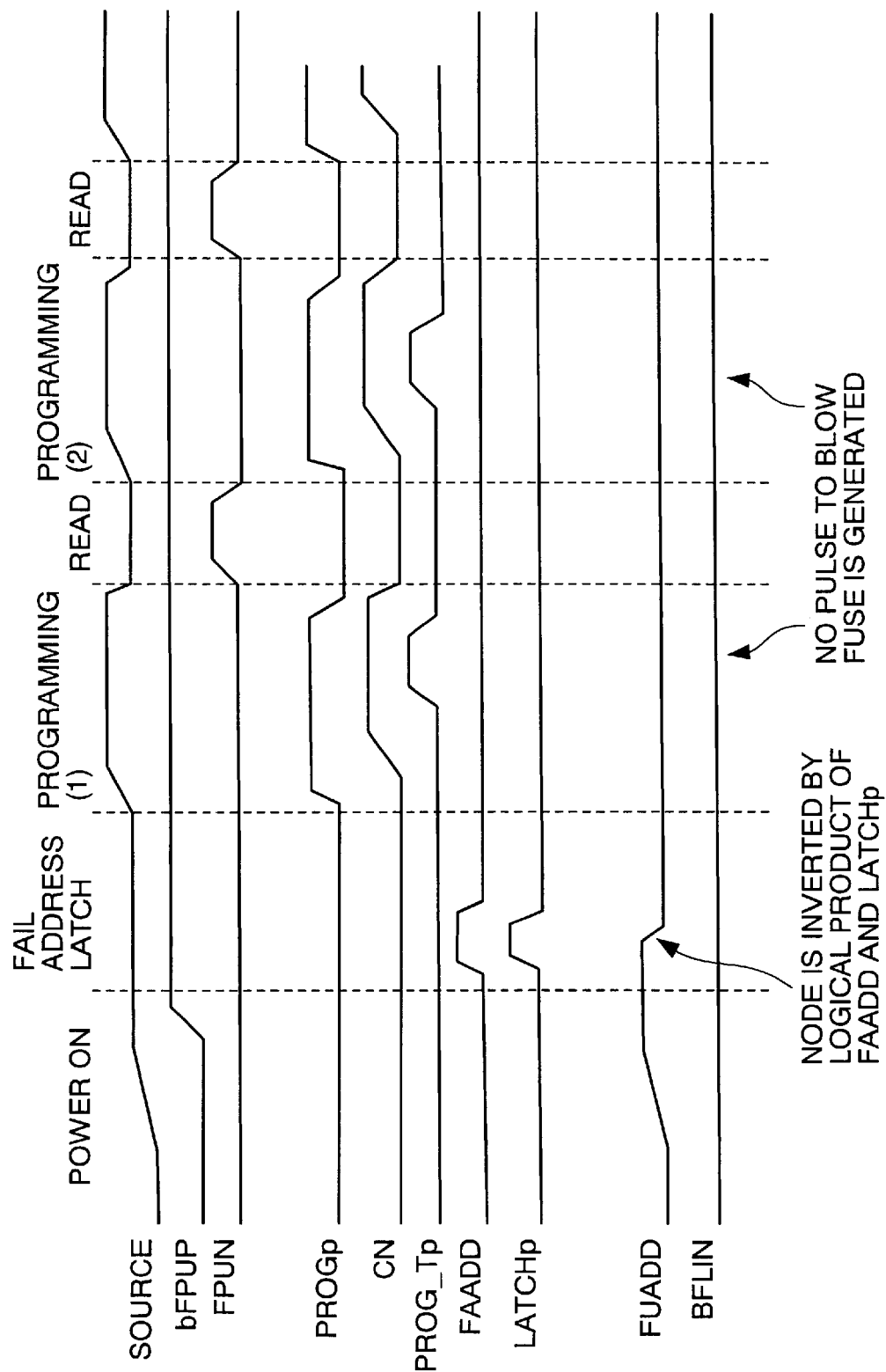
FIG. 4 is a diagram showing still other operating waveforms of the fuse circuit.

Next, a programming control operation of the fuse circuit unit 1 in FIG. 1 will be explained concretely referring to operating waveforms. Programming control is performed by the repetition of a plurality of programming cycles in which one programming time is restricted in consideration of dispersion of fuse blowing characteristics. FIG. 2 and FIG. 3 show waveforms in the fuse circuit unit 1 which corresponds to a fuse to be blown, FIG. 2 shows a case where the fuse is blown in a first programming (1), and FIG. 3 shows a case where the fuse is blown in a second programming (2). FIG. 4 shows waveforms in the fuse circuit unit 1 which corresponds to a fuse which is not blown.

The precharge signal bFPUP is "L" until the power source output SOURCE is stabilized from when the power source is turned on. During this period, the NMOS transistor Qn6 of the data latch circuit 11 is off, and the PMOS transistor Qp1 of the precharge circuit 14 is turned on, whereby the node FUADD of the data latch circuit 11 rises with the rise of the power source SOURCE and is precharged to "H". Thereafter, the precharge signal bFPUP changes to "H", and the precharge circuit 14 becomes off. The operation then advances to a fail address latching cycle, the latch signal LATCHp changes to "H", and the fail address FAADD is supplied. The fail address FAADD is "L" for an address which needs to blow the fuse (FIG. 2 and FIG. 3) and "H" for an address which need not blow the fuse (FIG. 4).

As the result of the logical product of the latch signal LATCHp and the fail address FAADD, the node FUADD of the data latch circuit 11 maintains "H" in the fuse address which needs to blow the fuse (FIG. 2 and FIG. 3), and changes to "L" in the fuse address which need not blow the fuse (FIG. 4). The programming signal PROGp is "L" till the completion of this fail address latching cycle, and the common node CN maintains a low electric potential.

The operation then advances to the first programming cycle (1), and the programming signal PROGp changes to "H", and high voltage is supplied to each of the fuses 10 from the common node CN. At this time, the voltage of the power source SOURCE is increased simultaneously, which is desirable in that the application of a large voltage to a portion between a drain and a source of the transistor Qn2 is suppressed. While the transistor Qn1 of the selecting circuit 13 is off, the node A of the fuse (capacitor) 10 increases in electric potential by its coupling with the common node CN, whereby a large electric field is not applied to the fuse 10 during that period.

When the programming selecting signal PROG-Tp then changes to "H", the programming selecting signal BFLIN changes to "H" by the programming selecting circuit 13 in the fuse address which needs to blow the fuse (FIG. 2 and FIG. 3). In the fuse address which need not blow the fuse, the node FUADD is "L", and the programming selecting signal BFLIN="H" is not outputted from the programming selecting circuit 13 (FIG. 4). When the programming selecting signal BFLIN is "H", the node B is grounded, and the node A of the fuse 10 is grounded via the transistor Qn2. Thus, a large electric field is applied to the fuse 10, and the operation of destroying the insulating film is performed. On the other hand, the large electric field is not applied to the fuse 10 in the case where the programming selecting signal is "L".

When the programming cycle (1) is completed, the verification read is performed. On this occasion, the programming signal PROGp is changed to "H" to lower the common node CN to a low level, and thereafter the read signal FPUN is changed to "H" to read out fuse data to the data latch circuit 11. In the case where the fuse 10 has been blown, the node FUADD of the data latch circuit 11 is connected to the common node CN via the transistors Qn4, Qn3, and Qn2, and via the fuse 10 which has become conductive, and changes to "L" (FIG. 2).

When the fuse 10 is not blown notwithstanding the programming operation, the node FUADD maintains "H" (FIG. 3). In other words, in this verification read, the change from "H" to "L" of the node FUADD means that programming has been completed, but if the node FUADD maintains "H", it means that the programming has ended in failure.

The operation then advances to the second programming cycle (2), and the same programming operation as in the first programming cycle is performed. When the fuse is not blown by the first programming operation, the programming selecting signal BFLIN="H" is outputted again in this programming cycle (2) as shown in FIG. 3. Thereby, a high electric field is applied to the fuse 10, and the operation of destroying the insulating film is performed. When the fuse 10 is already blown by the first programming (1), the programming selecting signal BFLIN "H" is not outputted in this programming cycle (2) as shown in FIG. 2, and no large electric field is applied to the fuse.

Thereafter, verification read is performed again. When the fuse has been blown by the second programming (2), the node FUADD of the data latch circuit 11 changes to "L" in this verification read, and the completion of programming is reported (FIG. 3).

As stated above, in this embodiment, the data latch circuit 11 to hold the programmed fuse data is also used as a fail address latch circuit for fuse programming. Accordingly, a fail address latch circuit exclusive for fuse programming is unnecessary.

Furthermore, by monitoring the state of the node FUADD of the data latch circuit 11 which holds the fail address during the programming operation, it becomes possible to realize whether the fuse is programmed or not and change the number of times of programming operations according to each fuse. Namely, the programming operation can be stopped in each fuse, for which programming has been completed, by a feedback function of the programming selecting circuit 13. As a result, no electric current flows to the fuse, which has been blown during a previous programming cycle, in the succeeding programming cycles, thereby reducing wasteful electric power consumption. Since a wasteful electric current is not supplied, a drop in the programming voltage of the node CN common to the plurality of fuses 10 is prevented, whereby stable programming voltage is always supplied.

When the fuse circuit in FIG. 1 is mounted on a DRAM chip or the like, it is difficult to supply the fail address FAADD from the outside after packaging as described above. Accordingly, in practice it is desirable to mount the fuse circuit in FIG. 1 on an integrated circuit chip together with a BIST circuit which tests a cell array internally and generates fail addresses.

Figure 5:
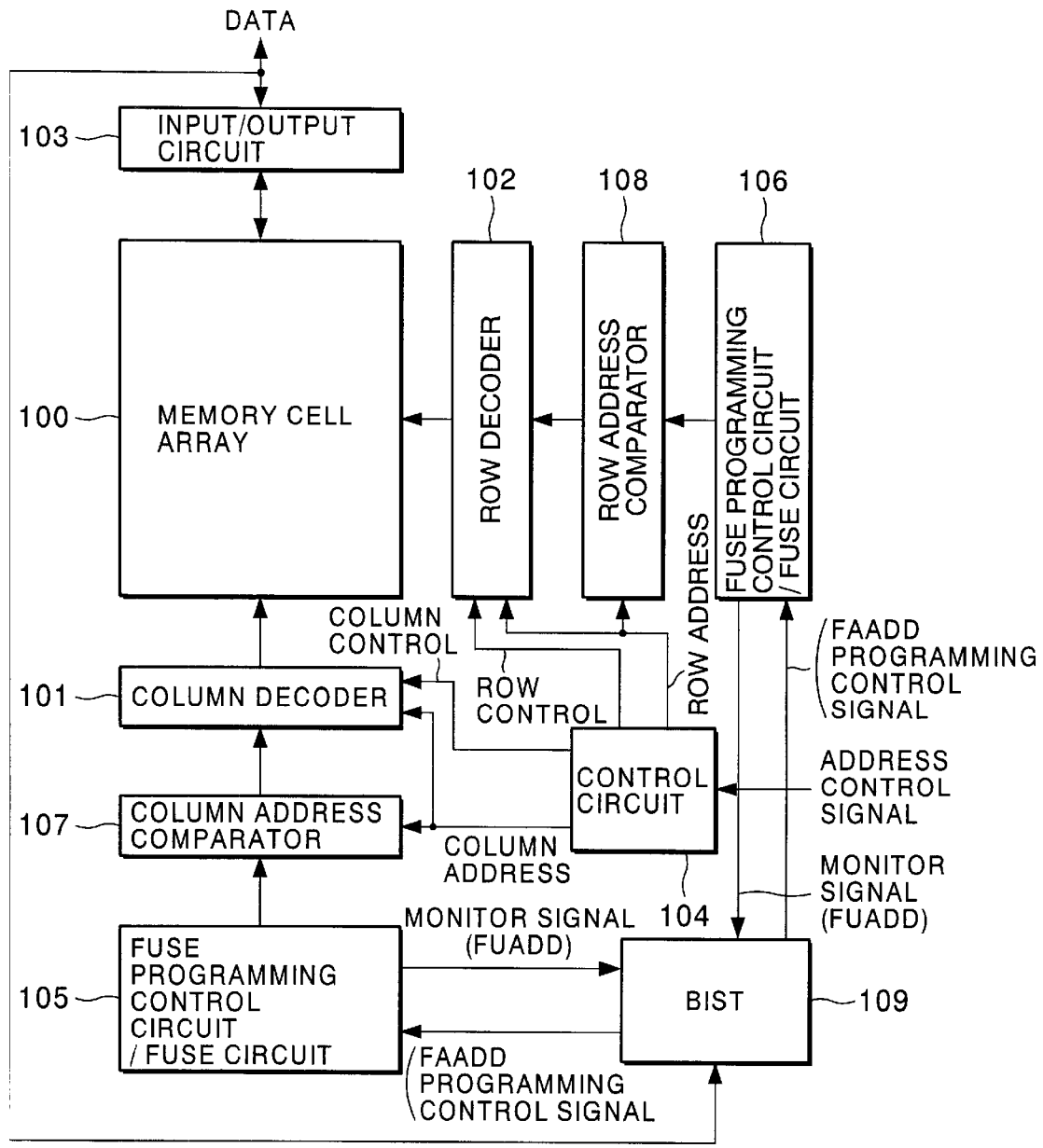
FIG. 5 is a diagram showing the configuration of a DRAM circuit according a second embodiment of the present invention.

FIG. 5 shows the configuration of a DRAM circuit of a DRAM including logic circuit in such an embodiment as a second embodiment. A memory cell array 100 includes a normal cell array and a redundant cell array to relieve defects arising in the normal cell array. A column decoder 101 and a row decoder 102 select a column and a row respectively for a memory cell in this memory cell array 100. An address supplied from the outside is transferred to the column decoder 101 and the row decoder 102 via a control circuit 104 and decoded.

Fuse circuits (including fuse programming control circuits) 105 and 106 are provided to store a fail address with respect to a column address and a row address respectively. A BIST circuit 109 is provided to give a cell array test, supply the fail addresses to these fuse circuits 105 and 106, and automatically perform programming control. Column and row address comparators 107 and 108 detect a coincidence of the fail address programmed into the fuse circuits 105 and 106 and an address supplied from the outside and replace a defective normal cell with a redundancy cell. Namely, a section including the fuse circuits 105 and 106 and the address comparators 107 and 108 composes a fail address storage circuit to perform switching control of a decoder circuit in the fail address.

The BIST circuit 109 is started by a test signal from the outside to test the memory cell array 100. In a test mode, test data are inputted from the BIST circuit 109 to an input/output circuit 103 and written in the memory cell array 100. The written data are then read out, and compared with expected value data in the BIST circuit 109. When they do not coincide as the result of comparison, this address is transferred as a fail address to the fuse circuits 105 and 106 and used for the fuse programming. A monitor signal obtained by the output node FUADD of the data latch circuit 11 explained in FIG. 1 is transferred to the BIST circuit 109 from the fuse circuits 105 and 106, and by this monitor signal, the programming operation is controlled and the completion thereof is judged.

Figure 6:
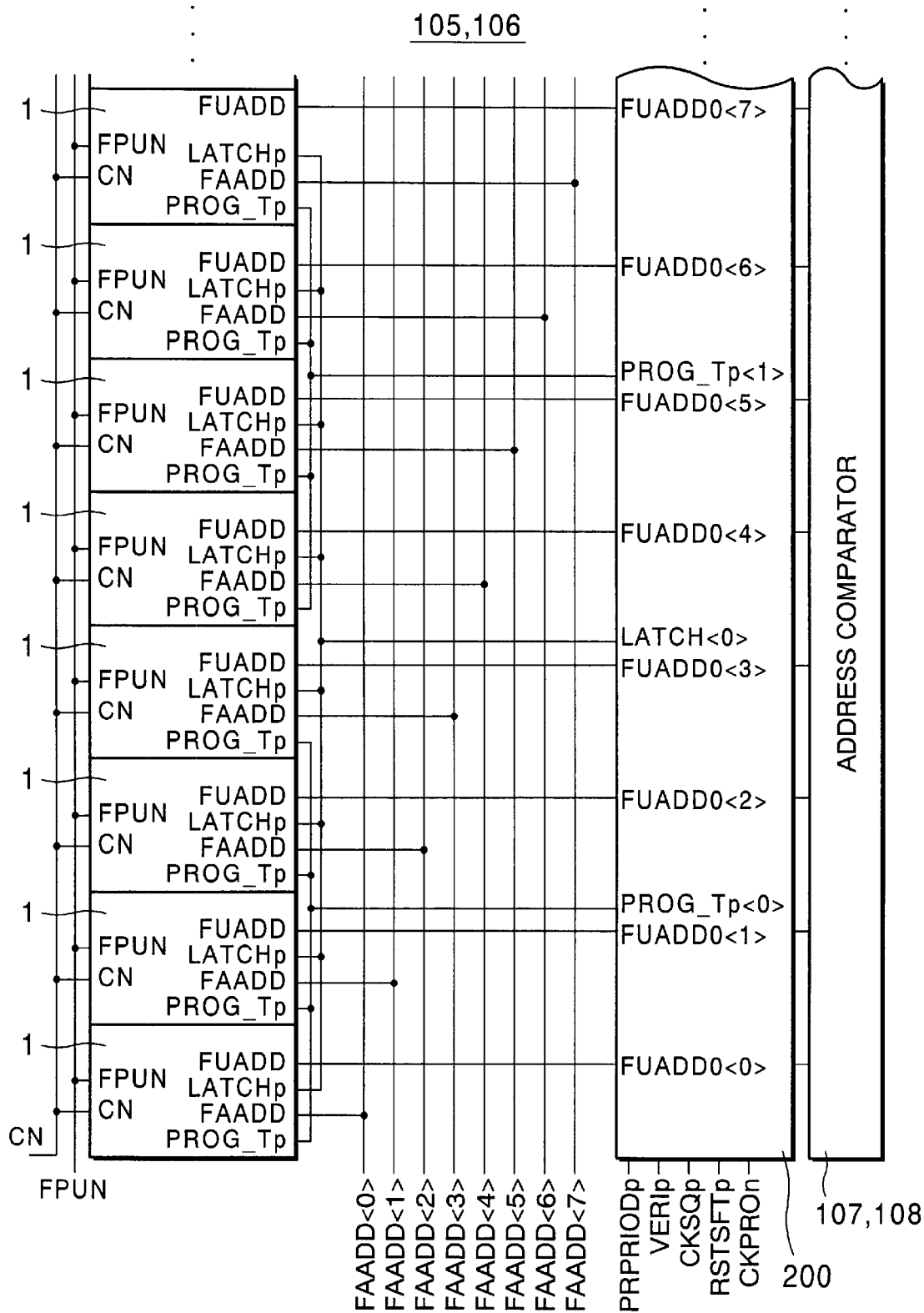
FIG. 6 is a diagram showing the configuration of a fuse circuit/fuse programming control circuit of the second embodiment.

In the concrete, the fuse circuits 105 and 106 are configured as shown in FIG. 6. Assuming that one defect is replaced with 8 bit data, the fuse circuit units 1 explained in FIG. 1 are arranged in multiples of 8 in this case. FIG. 6 shows only a region of eight fuse circuit units 1 which corresponds to a relief unit of 8 bits. Fail addresses FAADD <0> to FAADD <7> are transferred to the fuse circuit units 1 corresponding to 8 bits respectively from the BIST circuit 109, and latched by the data latch circuits 11 through a latch signal LATCH <0>.

Each of the fuse circuits 105 and 106 has a fuse programming control circuit 200 to which programming control signals CKPROn, RSTSFTp, VERIp and PRPRIODp sent from the BIST circuit 109 are transferred and which controls programming of the fuse circuit. The fuse programming control circuit 200 monitors the state of the output nodes FUADD <0> to FUADD <7> in respective fuse circuit units 1 and controls programming of the fuse circuit units 1.

In the example in FIG. 6, programming is controlled with respect to a relief unit of 8 bits with four fuse circuit units 1 as one group, and programming is performed for respective groups in turn. More specifically, the programming control circuit 200 supplies programming selecting signals PROG-Tp <0>, <1>, . . . to respective groups composed of four fuse circuit units 1. However, the number of fuse circuit units 1 of one group to be programmed simultaneously is not limited to four. It is determined according to fuse characteristics, and a relief unit composed of eight fuse circuit units 1 may be programmed simultaneously or each one fuse circuit unit 1 may be programmed.

Figure 7:
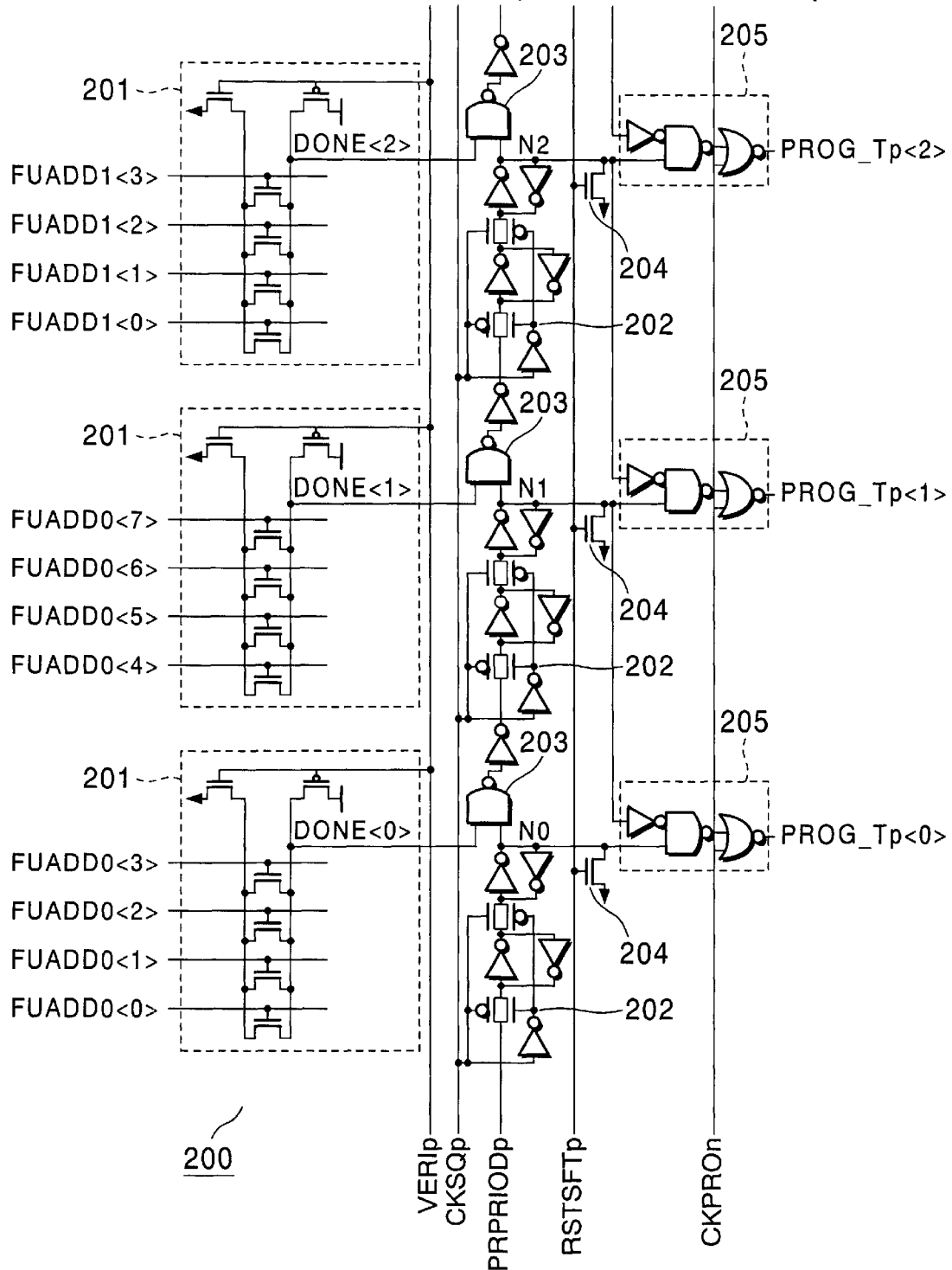
FIG. 7 is a diagram showing the concrete configuration of the fuse programming control circuit.

The programming control circuit 200 is configured in the concrete as shown in FIG. 7. A completion judging gate 201 judges whether programming is completed or not with respect to each 4 bit data latch circuit output from the fuse circuit units 1 by means of their OR logic. The programming control signal PRPRIODp is "H" over the whole period of programming. Provided are shift registers 202 which are shifted in sequence by a clock CKSQp in order to transmit this signal PRPRIODp to the next group of 4 bits after the completion of programming in the fuse circuit units 1 of one group is judged.

Incidentally, a circuit to generate latch signals LATCH <0>, <1>, . . . is omitted in FIG. 7, but any circuit is available as long as this circuit can operate to fetch a fail address into the data latch circuits 11 every 8 bits.

When all of the output nodes FUADD <0> to <3> are "L", a judging signal DONE <i> outputted from the completion judging gate 201 becomes "H" (completion). Thus, a NAND gate 203 disposed between respective 4 bit shift registers 202 becomes active, and an "H" state of a node Ni of the shift register 202 is transmitted to the next node N(i+1). Selecting signal output gates 205 to sequentially activate programming selecting circuits 13 are provided so that a programming selecting signal PROG-Tp <i> becomes inactive and the next programming selecting signal PROG-Tp <i+1> becomes active by a logic between the adjoining nodes Ni and N(i+1). Thereby, fuses in a group i are programmed in sequence. A transistor 204 for reset is provided in each node Ni.

An operation in the case where the fuse circuit/fuse programming control circuit configuration in FIG. 6 and FIG. 7 is used will be explained referring to waveforms in FIG. 8. The period of the operation is divided into a fuse data latch period and a programming/programming verification period. During the data latch period, in this example, the fail address data FAADD <0> to <7> which correspond to a defect relief unit of 8 bits are transferred from the BIST circuit 109 and transferred all at once to the data latch circuits of eight fuse circuit units 1 by the latch signal LATCH <0> and held therein. Thus, the output nodes FUADD <0> to <7> of the data latch circuits are "H" in an address which needs to be programmed and "L" in an address which need not be programmed.

The next 8 bit fail address data are also latched in the next eight fuse circuits by the next latch signal LATCH <1>. Thereafter, by repeating the similar operation, respective 8 bit fail address data are inputted and latched.

In the early stages of this fail address latch period, the reset signal RSTSFTp changes to "H", the reset transistor 204 is turned on, and all of the nodes Ni changes to "L". Hence, the programming selecting signal PROG-Tp <1> is not outputted during the fail address latch period.

The operation then advances to the programming period, and the signal PRPRIODp changes to "H". FIG. 8 shows the case where programming is executed for each group of 4 bit fuse circuit units simultaneously in two cycles. When the clock CKSQp changes to "H", the signal PRPRIODp is transferred to a node N0. The clock CKPROn changes to "L" two times during the cycle of the clock CKSQp. This clock CKPROn allows the programming selecting signal PROG-Tp <0>="H" to be outputted two times to the first 4 bits from the selecting signal output gate 205 by the logic of the node N0 (="H") and N1 (="L").

By this programming selecting signal PROG-Tp <0>, as previously explained in FIG. 1, programming and verification read are performed two times simultaneously for the fuse circuits units corresponding to 4 bits. When all fuse programming in 4 bit units has succeeded, all of the output nodes FUADD <0> to <3> change to "L". FIG. 8 shows the case where fuse blowing fails in the first cycle of the clock CKSQp and succeeds in the next cycle of the clock CKSQp.

When programming corresponding to 4 bits is completed, as explained in FIG. 1, all of four output nodes FUADD0 <0> to <3> of the fuse circuit units 1 change to "L" by the read signal FPUN. The judging signal DONE <0>="H" is outputted from the completion judging gate 201 activated by the verification signal VERIp="H". Thus, the NAND gate 203 becomes active, and "H" at the node N0 is transferred by the clock CKSQp, whereby the next node N1 changes to "H". In synchronization with the clock CKPROn, the programming selecting signal PROG-Tp="H" for the next 4 bits in place of the previous 4 bits is outputted to execute the cycle of programming and verification read for the fuse circuit units 1.

Figure 8:
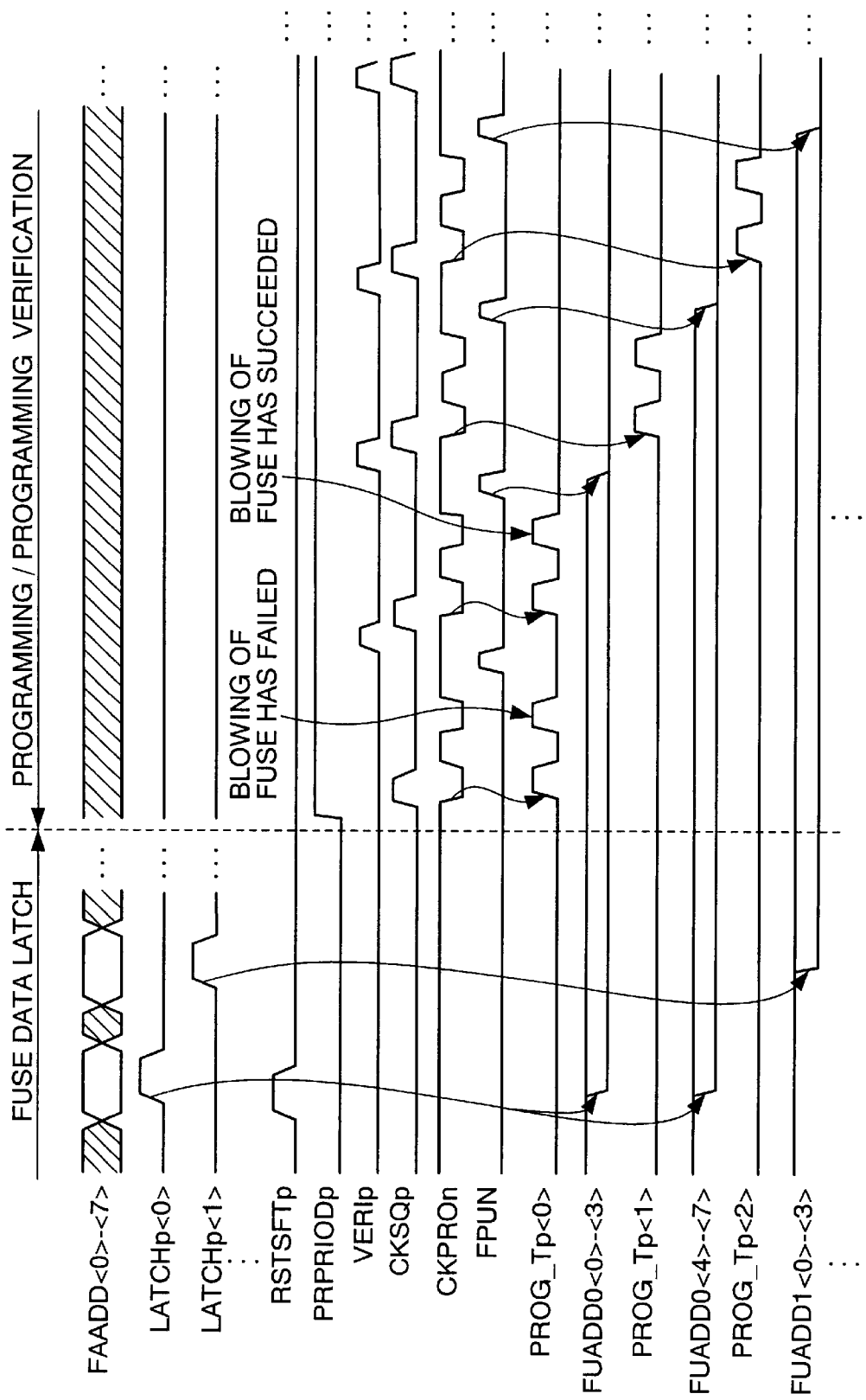
FIG. 8 is a diagram showing operating waveforms of the fuse circuit.

FIG. 8 shows the case where programming corresponding to 4 bits is completed by the programming selecting signal PROG-Tp <1> during one cycle of the clock CKSQp, in other words, all of the FUADD0 <4> to <7> change to "L" by verification read. Thereafter, the similar operation is repeated. FIG. 8 shows waveforms until with respect to the first 4 bits of the next defect relief unit (8 bits), programming is completed during one cycle of the clock CKSQp, in other words, all of the FUADD1 <0> to <3> change to "L" by verification read.

As described above, numerous fuse circuit units, in which a relief unit is 8 bits, can be programmed collectively in each group of four bits by fail addresses and control signals sent from the BIST circuit 109. In this case, programming and verification read are performed in a plurality of cycles for each group of 4 bits of fuses, which enables efficient fuse programming without wasteful electric power consumption. Namely, when the blowing of a fuse has succeeded in some programming cycle as described above, the programming selecting circuit 13 operates so that no high voltage is applied to the same fuse circuit unit 1 in the next programming cycle.

Its effects are examined specifically with a case where four fuses are blown in one programming by using high programming voltage. In this case, it is assumed that, for example, three of the four fuses are easy to blow. On this occasion, if the three fuses are blown earlier, these fuses become conductive, and a penetration current flows. Therefore, a drop in the voltage of the common node CN which supplies programming voltage occurs, which causes the possibility that the remaining one fuse can not be blown.

On the other hand, in this embodiment, programming is performed in a plurality of cycles. If a fuse is blown in some cycle, programming selection is not performed for the already blown fuse in the next cycle. Hence, a drop in the voltage of the common node CN does not occur, and programming for the remaining fuses can be performed without any trouble. Consequently, any wasteful current does not flow, and besides programming efficiency becomes excellent.

Moreover, the completion of programming can be detected in each group of fuses, and the programming operation advances to the next fuse group in sequence by the detection. Accordingly, it is unnecessary to be aware of the location of a fuse to be programmed from the outside. When all programming is completed, the completion of programming for all fuses can be reported to the outside by the DONE signal, which indicates the result of programming for the last four fuses, being "H".

The present invention is not limited to a DRAM, but can be applied likewise to semiconductor integrated circuits having various memories adopting a redundancy circuit system such as an SRAM and an EEPROM.

A fuse circuit according to the present invention is not limited to a use for storing a fail address in a redundancy circuit system memory, and it is effective when it is necessary to electrically write data and store them in a non-volatile state inside an integrated circuit chip after packaging.

According to the aforesaid embodiment, a semiconductor integrated circuit device including a fuse circuit enabling efficient electrical programming control without using a dedicated register to store fuse addresses can be obtained.

What is claimed is:

1. A semiconductor integrated circuit device, comprising:
   a fuse to be electrically programmed;
   a data latch circuit configured to hold fuse data programmed in the fuse after the fuse is programmed;
   a data preset circuit configured to set any kind of data polarity to be programmed into the fuse in the data latch circuit before the fuse is programmed; and
   a programming selecting circuit coupled to an output of the data latch circuit and configured to internally evaluate whether to perform or not to perform a programming operation for the fuse according to the data polarity in the data latch circuit.

2. The semiconductor integrated circuit device according to claim 1, further comprising:
   a read circuit configured to read the fuse data programmed into the fuse and transfer the fuse data to the data latch circuit between the fuse and the data latch circuit,
   wherein the programming selecting circuit performs such control that it detects that the state of the data preset in the data latch circuit is inverted by a read operation by the read circuit after programming and prohibits a second programming operation for the fuse.

3. The semiconductor integrated circuit device according to claim 2, further comprising:
   a programming control circuit configured to perform the fuse programming operation in a plurality of cycles, each of which has a fuse blowing operation and its verification read operation.

4. The semiconductor integrated circuit device according to claim 1,
   wherein the fuse is plural;
   the data latch circuit and the program selecting circuit are also plural and correspond to the respective fuses; and
   the semiconductor integrated circuit further comprises a programming control circuit configured to divide the fuses into a plurality of groups and perform an operation of programming fuses all at once in the respective groups in turn.

5. The semiconductor integrated circuit device according to claim 4,
   wherein the programming control circuit is controlled by a clock, and performs such control that the fuse programming operation in each group is performed in a plurality of cycles, each of which has a fuse blowing operation and its verification read operation.

6. The semiconductor integrated circuit device according to claim 4,
wherein the programming control circuit comprises:
a completion judging circuit configured to monitor the state of the data in the data latch circuits corresponding to a plurality of fuses in each group and judge whether programming for all fuses to be programmed in the group is completed or not; and
a selecting signal output circuit configured to output a selecting signal for activating the programming selecting circuits in each group in sequence in response to a judging signal obtained from the completion judging circuit.

7. The semiconductor integrated circuit device according to claim 1,
wherein the fuse is a capacitor-type fuse which includes an insulating film and which becomes conductive by destroying the insulating film by application of a voltage.

8. The semiconductor integrated circuit device according to claim 7, further comprising:
a read circuit configured to detect whether the fuse is conductive or not and have the data latch circuit hold it as a detecting result,
wherein the programming selecting circuit prohibits a second programming operation for the fuse in the case where the detecting result held in the data latch circuit indicates that the fuse is conductive in a read operation by the read circuit after programming.

9. A semiconductor integrated circuit device, comprising:
a memory cell array having a normal cell array and a spare cell array for replacing a defect cell in the normal cell array;
a decode circuit configured to select a memory cell from the memory cell array; and
a fail address storage circuit configured to store a fail address and output a replacing signal when an inputted address coincides with the fail address to switch-control the decode circuit so that the spare cell array is selected, the fail address storage circuit including;
a plurality of fuses to be electrically programmed;
data latch circuits provided in the respective fuses to hold fuse data programmed into the fuses after the fuses are programmed;
data preset circuits configured to preset fail address data to be programmed in the respective data latch circuits before the fuses are programmed; and
programming selecting circuits configured to monitor states of data in the respective data latch circuits and select whether to perform or not to perform a programming operation for each of the fuses; and
a programming control circuit configured to divide the plurality of fuses into a plurality of groups and perform an operation of programming fuses all at once in the respective groups in turn.

10. The semiconductor integrated circuit device according to claim 9,
wherein the programming control circuit is controlled by a clock, and performs such control that the fuse programming operation in each group is performed in a plurality of cycles, each of which has a fuse blowing operation and its verification read operation.

11. The semiconductor integrated circuit device according to claim 9,
wherein the programming control circuit comprises:
a completion judging circuit configured to monitor the state of the data in the data latch circuits corresponding to a plurality of fuses in each group and judge whether programming for all fuses to be programmed in the group is completed or not; and
a selecting signal output circuit configured to output a selecting signal for activating the programming selecting circuits in each group in sequence in response to a judging signal obtained from the completion judging circuit.

12. The semiconductor integrated circuit device according to claim 9, further comprising:
a test circuit configured to test the memory cell array by a start from the outside to detect a fail address and transfer the fail address to the fail address storage circuit.

13. The semiconductor integrated circuit device according to claim 9,
wherein the fuses are capacitor-type fuses each of which includes an insulating film and which becomes conductive by destroying the insulating film by application of a voltage.

14. The semiconductor integrated circuit device according to claim 13, wherein each of the fail address storage circuit further comprises a read circuit configured to detect whether each fuse is conductive or not and have the data latch circuit hold it as a detecting result,
wherein each of the programming selecting circuits prohibits a second programming operation for the fuse in the case where the detecting result held in the data latch circuit indicates that the fuse is conductive in a read operation by the read circuit after programming.

15. A semiconductor integrated circuit device, comprising:
a plurality of fuses to be electrically programmed;
data latch circuits provided in the respective fuses to latch data to be programmed in the fuses;
programming selecting circuits configured to monitor states of data in the respective data latch circuits and select whether to perform or not to perform a programming operation for each of the fuses;
a programming control circuit configured to divide the plurality of fuses into a plurality of groups and perform an operation of programming fuses all at once in the respective groups in turn; and
read circuits configured to perform a read operation of fuse data programmed in each fuse after a programming operation for a plurality of fuses in a predetermined group by the programming control circuit,
wherein the programming control circuit comprises:
a completion judging circuit configured to judge in each group whether programming for all fuses to be programmed in the group is completed or not based on the read operation by the read circuit; and
a selecting signal output circuit configured to output a selecting signal for activating the programming selecting circuits in each group in sequence in response to a judging signal obtained from the completion judging circuit.

16. The semiconductor integrated circuit device according to claim 15, further comprising:
data preset circuits configured to preset data to be programmed into the fuses in the data latch circuits before the fuses are programmed in each group.

17. The semiconductor integrated circuit device according to claim 16, wherein each of the programming selecting circuits performs such control that it detects that the state of the data preset in the data latch circuit is inverted by a read operation by the read circuit after programming and prohibits a second programming operation for the fuse.

18. The semiconductor integrated circuit device according to claim 16, further comprising:
   a test circuit configured to test the memory cell array by a start from the outside to detect a fail address and transfer the fail address to the respective data preset circuits.

19. The semiconductor integrated circuit device according to claim 15,
   wherein the fuses are capacitor-type fuses each of which includes an insulating film and which becomes conductive by destroying the insulating film by application of a voltage.

20. The semiconductor integrated circuit device according to claim 19, wherein each of the fail address storage circuit further comprises a read circuit configured to detect whether each fuse is conductive or not and have the data latch circuit hold it as a detecting result,
   wherein each of the programming selecting circuits prohibits a second programming operation for the fuse in the case where the detecting result held in the data latch circuit indicates that the fuse is conductive in a read operation by the read circuit after programming.

21. A semiconductor integrated circuit device, comprising:
   a fuse to be electrically programmed;
   a data latch circuit configured to hold fuse data programmed into the fuse after the fuse is programmed;
   a data preset circuit configured to preset data to be programmed into the fuse in the data latch circuit before the fuse is programmed;
   a programming selecting circuit configured to monitor a state of data in the data latch circuit and select whether to perform or not to perform a programming operating for the fuse; and
   a read circuit configured to read the fuse data programmed into the fuse and transfer the fuse data to the data latch circuit between the fuse and the data latch circuit,
   wherein the programming selecting circuit performs such control that it detects that the state of the data preset in the data latch circuit is inverted by a read operation by the read circuit after programming and prohibits a second programming operation for the fuse.

22. The semiconductor integrated circuit device according to claim 21, further comprising:
   a programming control circuit configured to perform the fuse programming operation in a plurality of cycles, each of which has a fuse blowing operation and its verification read operation.

23. A semiconductor integrated circuit device, comprising:
   a fuse to be electrically programmed;
   a data latch circuit configured to hold fuse data programmed into the fuse after the fuse is programmed;
   a data preset circuit configured to preset data to be programmed into the fuse in the data latch circuit before the fuse is programmed; and
   a programming selecting circuit configured to monitor a state of data in the data latch circuit and select whether to perform or not to perform a programming operation for the fuse,
   wherein the fuse is plural;
   the data latch circuit and the program selecting circuit are also plural and correspond to the respective fuses; and
   the semiconductor integrated circuit further comprises a programming control circuit configured to divide the fuses into a plurality of groups and perform an operation of programming fuses all at once in the respective groups in turn.

24. The semiconductor integrated circuit device according to claim 23,
   wherein the programming control circuit is controlled by a clock, and performs such control that the fuse programming operation in each group is performed in a plurality of cycles, each of which has a fuse blowing operation and its verification read operation.

25. The semiconductor integrated circuit device according to claim 23, wherein the programming control circuit comprises:
   a completion judging circuit configured to monitor the state of the data in the data latch circuits corresponding to a plurality of fuses in each group and judge whether programming for all fuses to be programmed in the group is completed or not; and
   a selecting signal output circuit configured to output a selecting signal for activating the programming selecting circuits in each group in sequence in response to a judging signal obtained from the completion judging circuit.

26. The semiconductor integrated circuit device according to claim 23, wherein the fuse is a capacitor-type fuse which includes an insulating film and which becomes conductive by destroying the insulating film by application of a voltage.

27. The semiconductor integrated circuit device according to claim 26, further comprising:
   a read circuit configured to detect whether the fuse is conductive or not and have the data latch circuit hold it as a detecting result,
   wherein the programming selecting circuit prohibits a second programming operation for the fuse in the case where the detecting result held in the data latch circuit indicates that the fuse is conductive in a read operation by the read circuit after programming.

* * * * *